United States Patent
Kojima et al.

(10) Patent No.: US 11,633,872 B2
(45) Date of Patent: Apr. 25, 2023

(54) PROCESSING APPARATUS

(71) Applicant: DISCO CORPORATION, Tokyo (JP)

(72) Inventors: Yoshimasa Kojima, Tokyo (JP); Shohei Sasaki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/337,544

(22) Filed: Jun. 3, 2021

(65) Prior Publication Data

US 2021/0402635 A1     Dec. 30, 2021

(30) Foreign Application Priority Data

Jun. 29, 2020 (JP) .............................. JP2020-111522

(51) Int. Cl.
*B26D 5/00*       (2006.01)
*B26D 3/06*       (2006.01)
*H01L 21/304*     (2006.01)

(52) U.S. Cl.
CPC ............. *B26D 5/007* (2013.01); *B26D 3/065* (2013.01); *H01L 21/3043* (2013.01)

(58) Field of Classification Search
CPC ....... B26D 3/065; B26D 5/007; H01L 21/681; H01L 21/67092; H01L 21/3043
USPC .......................................................... 83/875
See application file for complete search history.

(56) References Cited

U.S. PATENT DOCUMENTS

| | | | | |
|---|---|---|---|---|
| 7,459,378 B2* | 12/2008 | Genda et al. | ..... | H01L 21/67132 257/E21.598 |
| 2015/0049171 A1* | 2/2015 | Ito | .......................... | G01N 27/82 348/46 |
| 2016/0067819 A1* | 3/2016 | Kuki et al. | ........... | B23K 26/364 219/121.82 |
| 2016/0279753 A1* | 9/2016 | Sekiya | ............... | B23Q 17/0909 |
| 2016/0284611 A1* | 9/2016 | Sekiya | .................... | H01L 21/78 |
| 2019/0035689 A1 | 1/2019 | Yamamoto | | |

FOREIGN PATENT DOCUMENTS

| JP | 2006140341 A | 6/2006 |
|---|---|---|
| JP | 2010087141 A | 4/2010 |

OTHER PUBLICATIONS

Office Action issued by the German Patent Office for counterpart German Application No. 10 2021 206 466.3, dated Feb. 15, 2023.

* cited by examiner

*Primary Examiner* — Ghassem Alie
(74) *Attorney, Agent, or Firm* — Greer Burns & Crain, Ltd.

(57) ABSTRACT

A processing apparatus includes a chuck table, a first and second image capturing units, a display device, and a controller. The first image capturing unit obtains a first image group of images captured of a processed groove in the workpiece at different positions along a thicknesswise direction, each including a piece of first image information representing a shape of the processed groove. The second image capturing unit obtains a second image group of images captured of the processed groove at different positions along the thicknesswise direction of the workpiece, each including a piece of second image information representing a shape of the processed groove. The controller orders the pieces of at least either the first or the second image information into a sequence along the thicknesswise direction, thereby generating a three-dimensional image of the processed groove, and displays the three-dimensional image on the display device.

6 Claims, 14 Drawing Sheets

PROCESSING APPARATUS

BACKGROUND OF THE INVENTION

Field of the Invention

The present invention relates to a processing apparatus for processing a reverse side of a workpiece while holding a face side of the workpiece with a plurality of devices formed on the face side.

Description of the Related Art

Semiconductor device chips for use in electrics such as mobile phones, or personal computers are fabricated by processing disk-shaped wafers, i.e., workpieces, made of a semiconductor material such as silicon. A workpiece has a plurality of projected dicing lines established on a face side thereof, and a plurality of devices such as integrated circuits (ICs), large-scale-integration (LSI) circuits, or micro electromechanical systems (MEMS) devices are formed in respective areas demarcated on the face side by the projected dicing lines. For fabricating device chips from the workpiece, a reverse side of the workpiece is ground to make the workpiece thinner to a predetermined thickness, and thereafter the workpiece is cut along the projected dicing lines to produce device chips that include the respective devices.

The workpiece is cut in a cutting step by a cutting apparatus that includes a cutting unit having a cutting blade mounted on an end of a spindle and a chuck table for holding the workpiece under suction thereon. In normal cutting steps, specifically, the face side of the workpiece is oriented upwardly and the reverse side of the workpiece is held under suction on the chuck table. After the reverse side of the workpiece has been held under suction on the chuck table, a first camera disposed above the chuck table captures an image of the face side of the workpiece for aligning the workpiece. The first camera has an image capturing device such as charge-coupled-device (CCD) image sensor, or a complementary metal-oxide-semiconductor (CMOS) image sensor.

An alignment process for positionally correcting the workpiece is carried out on the basis of the image captured by the first camera of the face side of the workpiece that bears an alignment mark or the like. After the alignment process, the workpiece is cut along the projected dicing lines by the cutting blade. In recent years, it has been customary to cut some workpieces from their reverse sides in order to meet demands for the fabrication of diverse types of devices from the workpieces (see, for example, Japanese Patent Laid-Open No. 2006-140341). In such applications, since the face side of the workpiece is oriented downwardly and held on the chuck table, the first camera disposed above the chuck table is unable to capture an image of the alignment mark or the like on the face side as the first camera faces the reverse side of the workpiece.

In view of the above difficulty, there has been developed a cutting apparatus including a chuck table made of a material that is transparent to visible light and a second camera for use with visible light that is disposed below the chuck table (see, for example, Japanese Patent Laid-Open No. 2010-87141). The chuck table made of a material that is transparent to visible light makes the second camera possible to capture an image of the face side of a workpiece from below the chuck table while the face side of the workpiece is being held on the chuck table. Recent years have seen many occasions where cutting blades cut relatively hard semiconductor substrates, e.g., substrates of silicon carbide (SiC), for use in semiconductor chips for power devices. According to such a cutting practice, a cutting blade may form a cut groove in a semiconductor substrate obliquely to a thicknesswise direction thereof or may form a tapered cut groove in a semiconductor substrate, possibly resulting in a reduction in a level of processing accuracy.

SUMMARY OF THE INVENTION

Consequently, it is desirable to assess how a cut groove has been formed in a substrate in order to confirm a level of processing accuracy achieved with respect to the cut groove. However, the existing cutting apparatus referred to above are only capable of individually confirming an image of the face side of a workpiece and an image of the reverse side thereof. Therefore, it is the current practice for the operator to visually inspect a formed cut groove with a microscope or the like. However, the visual inspection tends to lower the efficiency of the cutting process as it needs an additional visual inspection time after the cut groove has been formed. The present invention has been made in view of the above problems. It is an object of the present invention to provide a processing apparatus that allows the operator to confirm, on the processing apparatus, the level of processing accuracy achieved with respect to a cut groove.

In accordance with an aspect of the present invention, there is provided a processing apparatus for processing a plate-shaped workpiece while holding a face side of the workpiece that has a plurality of devices, each device being formed in respective areas demarcated by a plurality of projected dicing lines established on the face side, including a chuck table for holding the face side of the workpiece thereon, the chuck table having a holding member including a surface and another surface positioned opposite the surface and having a predetermined region made of a transparent material extending from the surface to the other surface, a processing unit for processing the workpiece whose face side is being held on the chuck table, thereby forming a processed groove in the workpiece, a first image capturing unit disposed above the chuck table and having a first image capturing device for capturing an image of the reverse side of the workpiece held on the chuck table, a second image capturing unit disposed below the chuck table and having a second image capturing device for capturing an image of the face side of the workpiece through the holding member, in an area corresponding in a thicknesswise direction of the workpiece to an area in which the first image capturing unit captures the image of the face side of the workpiece, a display device for displaying the image of the workpiece captured by at least either the first image capturing unit or the second image capturing unit, and a controller having a storage section for storing programs for performing an image processing process and a processing device for processing the images according to the programs stored in the storage section, in which the first image capturing unit obtains a first image group of images captured of the processed groove while positioning a focal point thereof at a plurality of different positions along the thicknesswise direction of the workpiece, each of the images of the first image group including a piece of first image information representing a shape of the processed groove, and the second image capturing unit obtains a second image group of images captured of the processed groove while positioning a focal point thereof at a plurality of different positions along the thicknesswise direction of the workpiece, each of the images of the second image group including a piece of second image information representing a shape of the processed groove, and in which the controller orders the pieces of at least either the first image information or the second image information into a sequence along the thicknesswise direction of the workpiece, thereby generating a three-dimensional image of the processed groove, and displays the three-dimensional image on the display device.

Preferably, the controller orders the pieces of both the first image information and the second image information into a sequence along the thicknesswise direction of the workpiece, thereby generating a three-dimensional image of the processed groove.

According to the aspect of the present invention, the controller orders the pieces of at least either the first image information included in the images of the first image group that are captured by the first image capturing unit while positioning the focal point thereof at a plurality of different positions along the thicknesswise direction of the workpiece or the second image information included in the images of the second image group that are captured by the second image capturing unit while positioning the focal point thereof at a plurality of different positions along the thicknesswise direction of the workpiece, into a sequence along the thicknesswise direction of the workpiece, thereby generating a three-dimensional image of the processed groove, and displays the three-dimensional image on the display device. Therefore, the operator can confirm the accuracy with which the processed groove has been processed by confirming the shape of the processed groove with the three-dimensional image displayed on the display device. Therefore, it is not necessary to deliver the workpiece from the processing apparatus to a microscope and to visually inspect the workpiece with the microscope. Furthermore, since the operator can confirm the accuracy with which the processed groove has been processed on the processing apparatus, the work efficiency is better than if the operator visually inspects the workpiece with a microscope.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
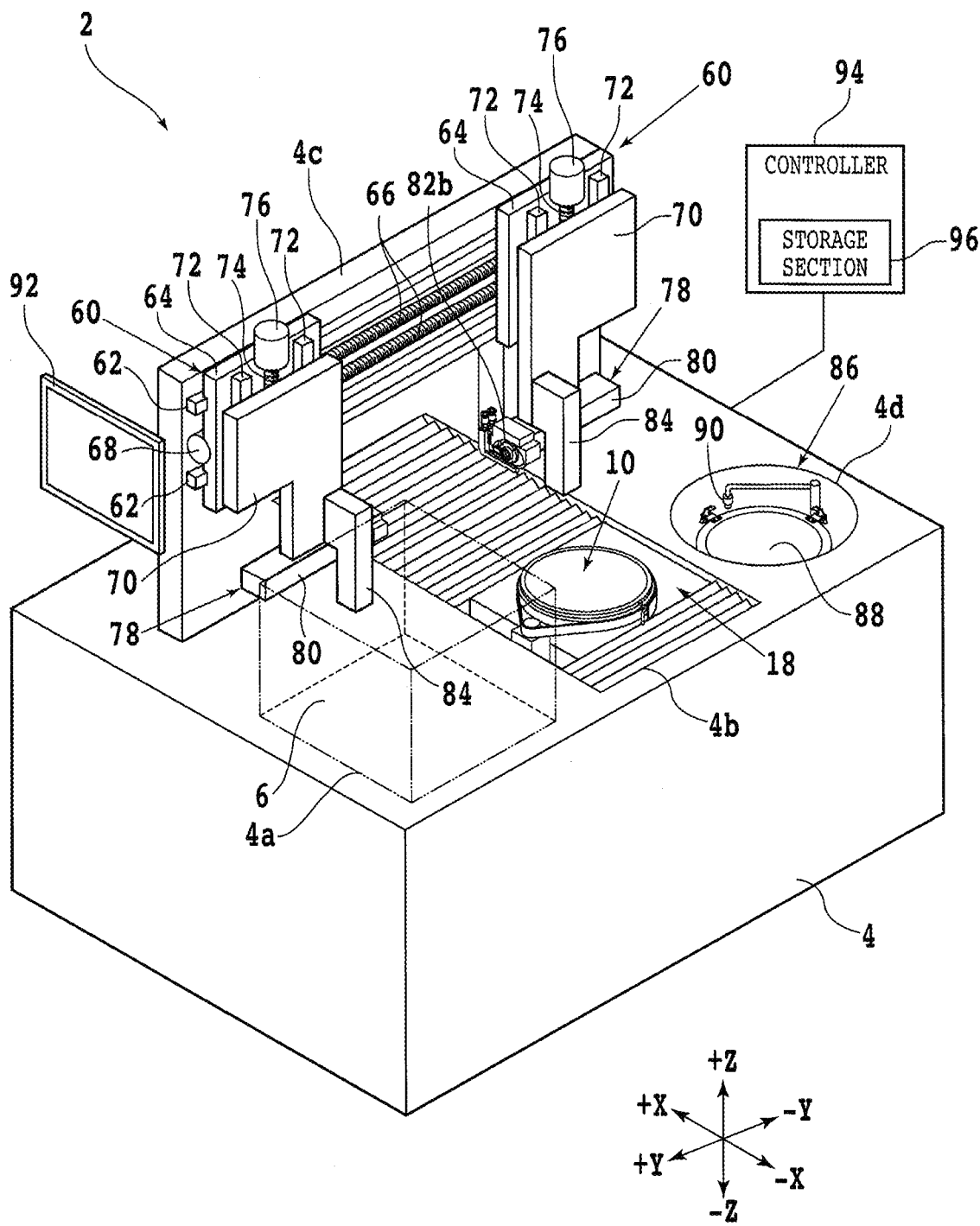
FIG. 1 is a perspective view of a cutting apparatus as a processing apparatus according to a first embodiment of the present invention.

Preferred embodiments of the present invention will be described in detail below with reference to the accompanying drawings. FIG. 1 illustrates in perspective a cutting apparatus 2 as a processing apparatus according to a first embodiment of the present invention. Incidentally, in FIG. 1, some components of the cutting apparatus 2 are illustrated in functional block form. X-axis directions, i.e., horizontal or processing feed directions, including +X direction and −X direction, Y-axis directions, i.e., horizontal or indexing feed directions, including +Y direction and a −Y direction, and Z-axis directions, i.e., vertical or incising feed directions, including +Z direction and a −Z direction to be described below with reference to the drawings are perpendicular to each other. The cutting apparatus 2 has a base block 4 that supports thereon various components of the cutting apparatus 2. The base block 4 has an upwardly open opening 4*a* defined in a front corner thereof in the +Y direction with a cassette elevator, not illustrated, movably disposed therein. The cassette elevator has an upper surface on which there is placed a cassette 6 housing a plurality of workpieces 11 (see FIG. 2) therein.

Figure 2:
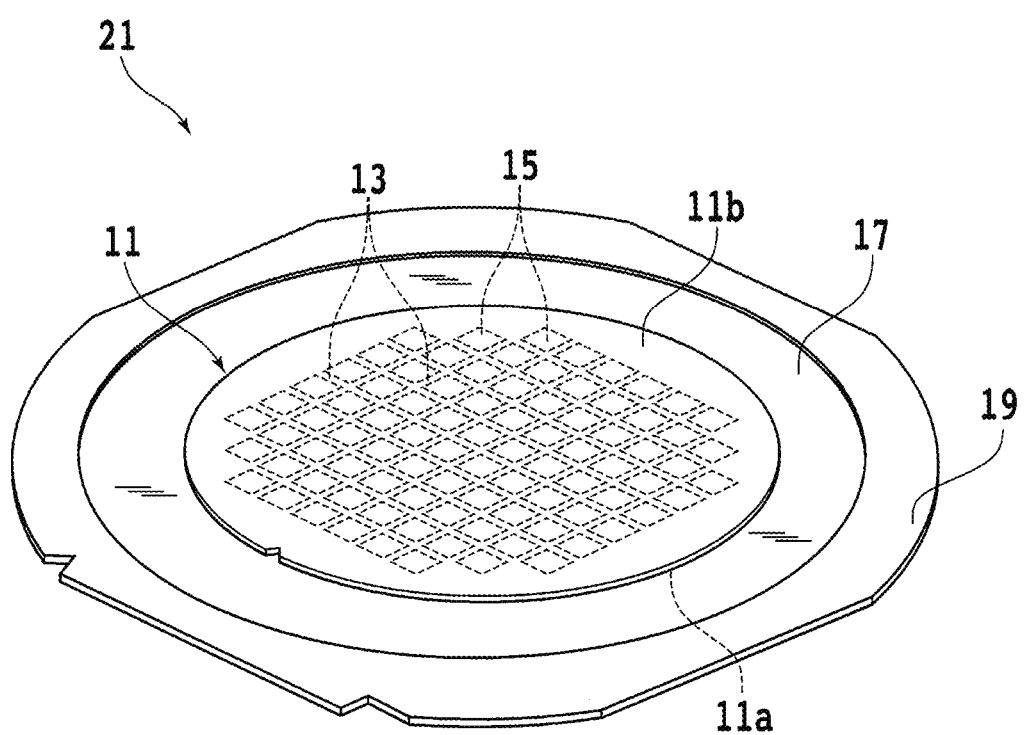
FIG. 2 is a perspective view of a workpiece unit.

In FIG. 1, only the profile of the cassette 6 is illustrated for illustrative purposes. According to the present embodiment, the workpiece 11 is in the form of a disk-shaped wafer made of a semiconductor material such as silicon. However, the workpiece 11 is not limited to any material, shape, structure, size, etc. The workpiece 11 may be, for example, a substrate made of another semiconductor material, ceramic, resin, metal, or the like. As illustrated in FIG. 2, the workpiece 11 has a face side 11*a* on a lower surface thereof having a plurality of areas demarcated by a grid of projected dicing lines or streets 13. The projected dicing lines 13 include those projected dicing lines 13 that extend in a first direction and those projected dicing lines 13 that extend in a second direction perpendicular to the first direction. Device 15 such as integrated circuit (IC) and alignment mark(s), not illustrated, are formed in each demarcated area on the face side 11*a*. However, devices 15 are not limited to any kind, number, shape, structure, size, layout, etc.

A circular tape, i.e., a circular dicing tape 17 that is larger in diameter than the workpiece 11 is affixed to the face side 11*a* of the workpiece 11. The tape 17 is made of a transparent material through which visible light can be transmitted. The tape 17 has is of a layered structure including a base layer and an adhesive layer, i.e., a glue layer. The base layer is made of polyolefin (PO) or the like. The adhesive layer is made of an adhesive resin such as ultraviolet (UV)-curable acrylic resin, for example. The adhesive layer of the tape 17 is affixed to the face side 11*a* of the workpiece 11. The tape 17 has an outer circumferential portion to which an annular frame 19 of metal is affixed. The workpiece 11 is thus supported on the frame 19 by the tape 17. The entire assembly including the workpiece 11, the tape 17, and the frame 19 is referred to as a workpiece unit 21 that is stored in the cassette 6. FIG. 2 illustrates the workpiece unit 21 in perspective.

As illustrated in FIG. 1, the base block 4 has an upwardly open opening 4b defined therein behind the opening 4a in the −Y direction. The opening 4b is elongate in the X-axis directions. A disk-shaped chuck table 10 is movably disposed in the opening 4b. Note that the chuck table 10 includes a disk-shaped annular frame suction plate, not illustrated, disposed on an outer circumferential portion thereof and having a plurality of discrete suction ports defined therein at circumferentially spaced intervals.

Figure 3:
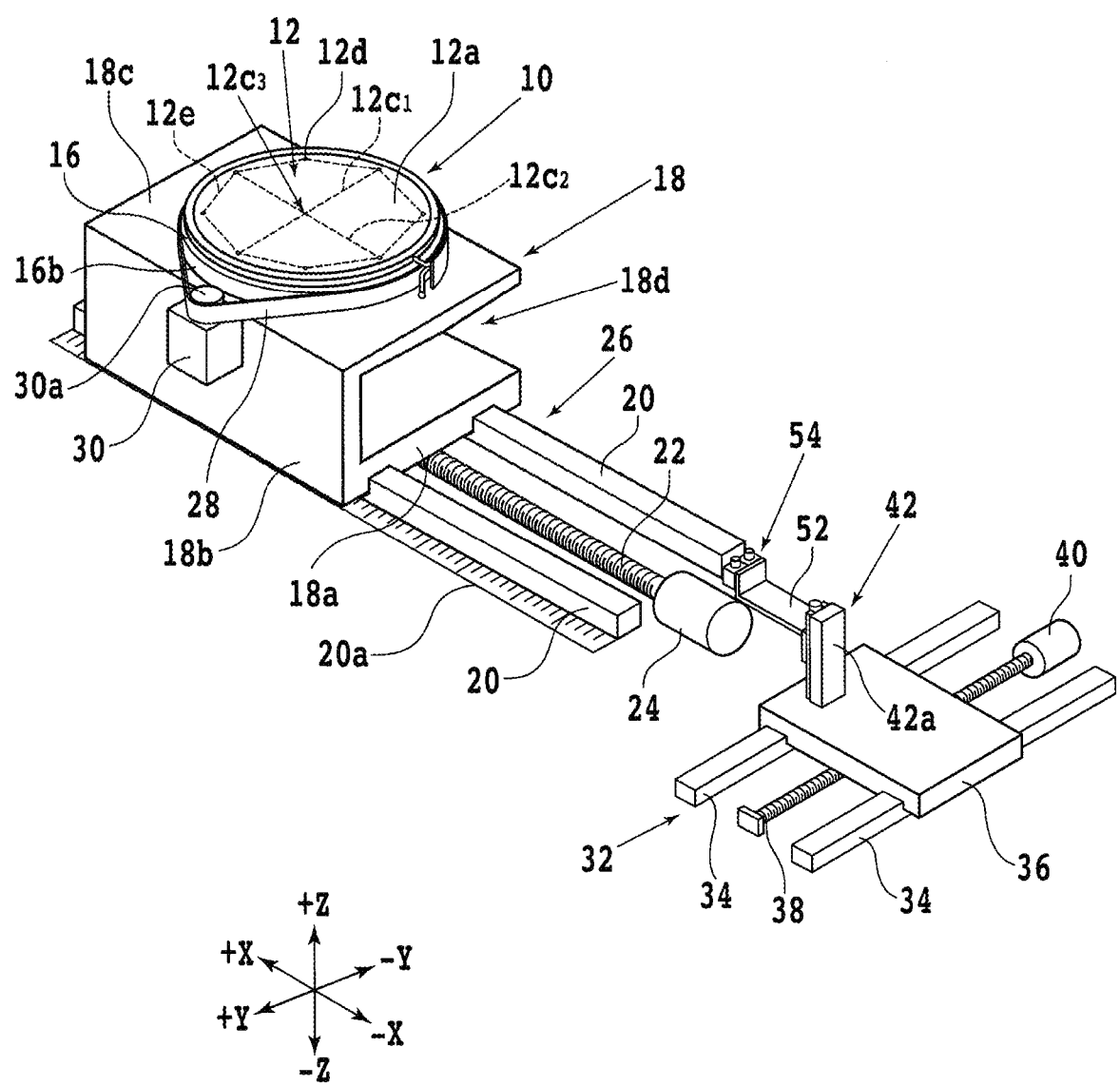
FIG. 3 is a perspective view of a chuck table and other components of the cutting apparatus.
Figure 4:
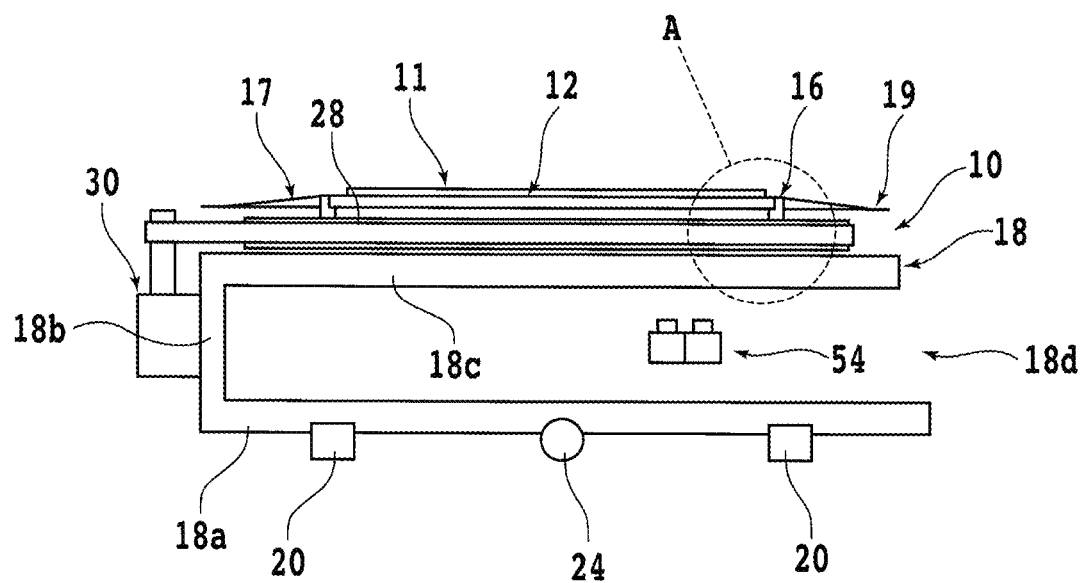
FIG. 4 is a side elevational view, partly in cross section, of the chuck table and other components.
Figure 4:
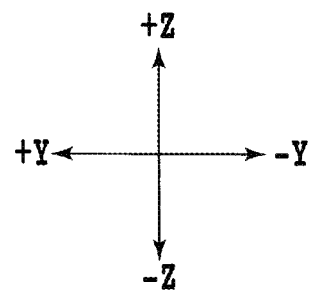
Figure 5:
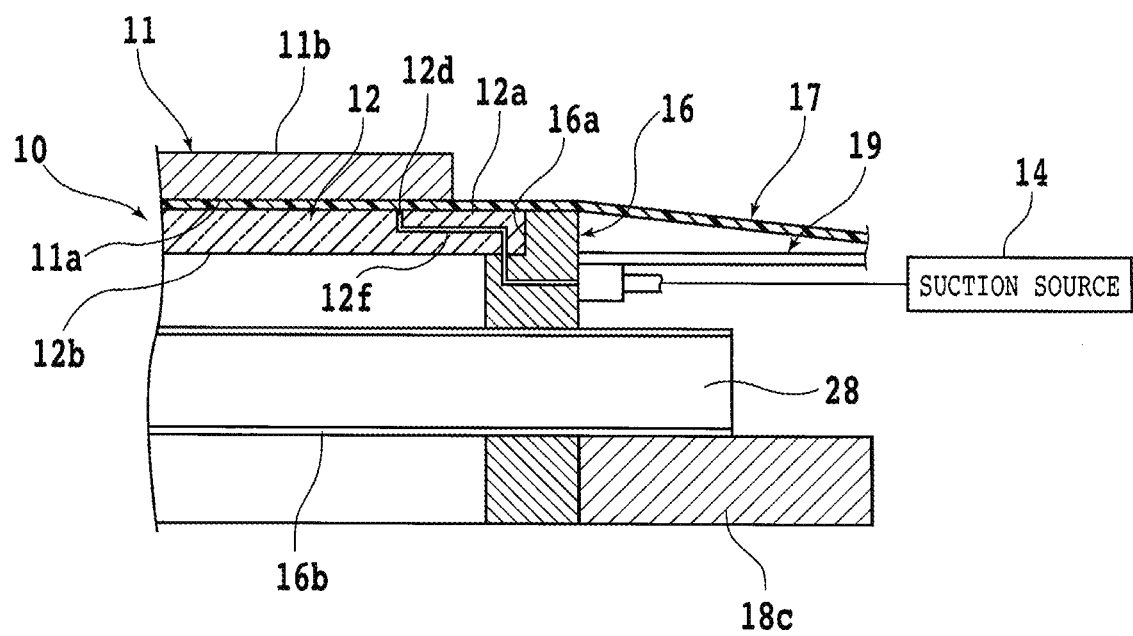
FIG. 5 is an enlarged view of a section A of FIG. 4.

The chuck table 10 and other components will hereinafter be described in detail below with reference to FIGS. 3 through 5. FIG. 3 illustrates the chuck table 10 and other components in perspective. FIG. 4 illustrates the chuck table 10 and other components in side elevation, partly in cross section. In FIG. 4, no hatching is illustrated. FIG. 5 illustrates at an enlarged scale a section A illustrated in FIG. 4. In FIG. 5, a component is illustrated in functional block form.

The chuck table 10 has a disk-shaped, i.e., plate-shaped, holding member 12. The holding member 12 has a generally flat surface 12a and another surface 12b (see FIG. 5) positioned opposite the surface 12a. The holding member 12 is made of a transparent material through which visible light can be transmitted, such as soda glass, borosilicate glass, or quartz glass. The holding member 12 has a plurality of fluid channels defined therein. Specifically, the fluid channels include a straight first suction channel $12c_1$ extending diametrically across the holding member 12 through the central axis of the disk shape thereof, as viewed in plan, i.e., along the Z-axis directions, and a straight second suction channel $12c_2$ extending diametrically across the holding member 12 through the central axis of the disk shape thereof perpendicularly to the first suction channel $12c_1$ in an XY plane defined by the X-axis directions and the Y-axis directions.

The first suction channel $12c_1$ and the second suction channel $12c_2$ intersect with each at a point $12c_3$ positioned at the central axis of the disk shape of the holding member 12, and are connected to each other. The holding member 12 also has a plurality of openings 12d defined in an outer circumferential portion thereof at circumferentially spaced intervals. The openings 12d have upper ends open at the surface 12a and extend from the surface 12a to a predetermined depth in the holding member 12 where the openings 12d terminate short of the other surface 12b. Some of the openings 12d are defined respectively at both ends of the first suction channel $12c_1$ and both ends of the second suction channel $12c_2$ and are connected thereto. The openings 12d are interconnected in circumferential directions of the holding member 12 by an outer circumferential suction channel 12e defined in an outer circumferential portion of the holding member 12 at the predetermined depth.

The openings 12d are also connected to a suction channel 12f defined in the holding member 12 and extending radially outwardly. A suction source 14 (see FIG. 5) such as an ejector is connected to the suction channel 12f. When the suction source 14 is actuated, it generates a negative pressure that acts in the openings 12d through the suction channel 12f. Therefore, the surface 12a of the holding member 12 where the openings 12d are open functions as a holding surface for holding the workpiece unit 21, i.e., the workpiece 11, under suction thereon. The fluid channels in the holding member 12, which include the first suction channel $12c_1$, the second suction channel $12c_2$, the openings 12d, the outer circumferential suction channel 12e, and the suction channel 12f, scatter or reflect light that is applied to the holding member 12. Therefore, the fluid channels in the holding member 12 as they are viewed from the surface 12a or the surface 12b may not be completely transparent to visible light but may be transmissive of light or may be opaque to light.

However, regions of the holding member 12 except these fluid channels are transparent from the surface 12a to the surface 12b. Specifically, four regions of the holding member 12 that are divided by the first suction channel $12c_1$ and the second suction channel $12c_2$ and that are positioned radially inwardly of the outer circumferential suction channel 12e are transparent from the surface 12a to the surface 12b. A hollow cylindrical frame 16 made of a metal material such as stainless steel is disposed on an outer circumferential surface of the holding member 12. The frame 16 has an opening 16a (see FIG. 5) defined in an upper portion thereof. The holding member 12 is disposed on the frame 16 in covering relation to the opening 16a.

As illustrated in FIGS. 3 and 4, the frame 16 is supported on an X-axis movable table 18. The X-axis movable table 18 includes a horizontal bottom plate 18a that is of a rectangular shape as viewed along the Z-axis directions. The X-axis movable table 18 also includes a vertical side plate 18b that is of a rectangular shape as viewed along the Y-axis directions and that has a lower end joined to a front end of the bottom plate 18a in the +Y direction, and a top plate 18c that is of a rectangular shape as viewed along the Z-axis directions as with the bottom plate 18a and that has a front end joined to an upper end of the side plate 18b. The bottom plate 18a and the top plate 18c jointly define a space 18d therebetween that is open at a rear end thereof in the −Y direction and also at both side ends thereof in the X-axis directions.

The bottom plate 18a is slidable on and along a pair of X-axis guide rails 20 disposed below the bottom plate 18a in the −Z direction and extending generally parallel to each other in the X-axis directions. The X-axis guide rails 20 are fixedly mounted on an upper surface of a stationary base, not illustrated. An X-axis linear scale 20a for use in the detection of the position of the X-axis movable table 18 in the X-axis directions is disposed adjacent to and extends along one of the X-axis guide rails 20. A reading head, not illustrated, is mounted on a lower surface of the X-axis movable table 18 in facing relation to the X-axis linear scale 20a.

When the X-axis movable table 18 moves in one of the X-axis directions along the X-axis guide rails 20, the reading head reads graduations of the X-axis linear scale 20a for the calculation of the position or coordinate in the X-axis directions of the X-axis movable table 18 and the distance that the X-axis movable table 18 has moved in the X-axis directions. A nut, not illustrated, is mounted on a lower surface of the bottom plate 18a of the X-axis movable table 18 and is operatively threaded over an X-axis ball screw 22 disposed between and extending generally parallel to the X-axis guide rails 20.

The X-axis ball screw 22 has an end coupled to an X-axis stepping motor 24. When the X-axis stepping motor 24 is energized, it rotates the X-axis ball screw 22 about its central axis, causing the nut to move the X-axis movable table 18 in one of the X-axis directions along the X-axis guide rails 20. The X-axis guide rails 20, the X-axis ball screw 22, the X-axis stepping motor 24, etc. jointly make up an X-axis moving mechanism 26 for moving the X-axis movable table 18 along the X-axis guide rails 20. The frame 16 is rotatably supported on an upper surface of the top plate 18c of the X-axis movable table 18 for rotation about a central axis generally parallel to the Z-axis directions. The frame 16 includes a pulley portion 16b defined by a cylindrical side surface thereof. The pulley portion 16b of the frame 16 that is supported on the X-axis movable table 18 is positioned above the top plate 18c thereof.

A rotary actuator 30 such as an electric motor is mounted on the side plate 18b of the X-axis movable table 18. The rotary actuator 30 has a rotational shaft with a pulley 30a mounted thereon. An endless belt, i.e., a belt 28, is trained around the pulley 30a and the pulley portion 16b. When the rotary actuator 30 is energized, it rotates its rotational shaft, rotating the pulley 30a to move the endless belt 28 to rotate the frame 16 and hence the chuck table 10 about their central axis generally parallel to the Z-axis directions. By controlling the rotation of the pulley 30a, it is possible to turn the chuck table 10 through a desired angle about the central axis.

A Y-axis moving mechanism 32 is disposed on an extension of the X-axis moving mechanism 26 in the X-axis directions. The Y-axis moving mechanism 32 includes a pair of Y-axis guide rails 34 extending generally parallel to each other in the Y-axis directions. The Y-axis guide rails 34 are fixedly mounted on the upper surface of the stationary base, not illustrated. A Y-axis movable table 36 is slidable on and along the Y-axis guide rails 34. A nut, not illustrated, is mounted on a lower surface of the Y-axis movable table 36 and is operatively threaded over a Y-axis ball screw 38 disposed between and extending generally parallel to the Y-axis guide rails 34.

The Y-axis ball screw 38 has an end coupled to a Y-axis stepping motor 40. When the Y-axis stepping motor 40 is energized, it rotates the Y-axis ball screw 38 about its central axis, causing the nut to move the Y-axis movable table 36 in one of the Y-axis directions along the Y-axis guide rails 34. The Y-axis guide rails 34, the Y-axis ball screw 38, the Y-axis stepping motor 40, etc. jointly make up the Y-axis moving mechanism 32 for moving the Y-axis movable table 36 along the Y-axis guide rails 34. A Y-axis linear scale, not illustrated, for use in the detection of the position of the Y-axis movable table 36 in the Y-axis directions is disposed adjacent to and extends along one of the Y-axis guide rails 34. A reading head, not illustrated, is mounted on a lower surface of the Y-axis movable table 36 in facing relation to the Y-axis linear scale.

Figure 6:
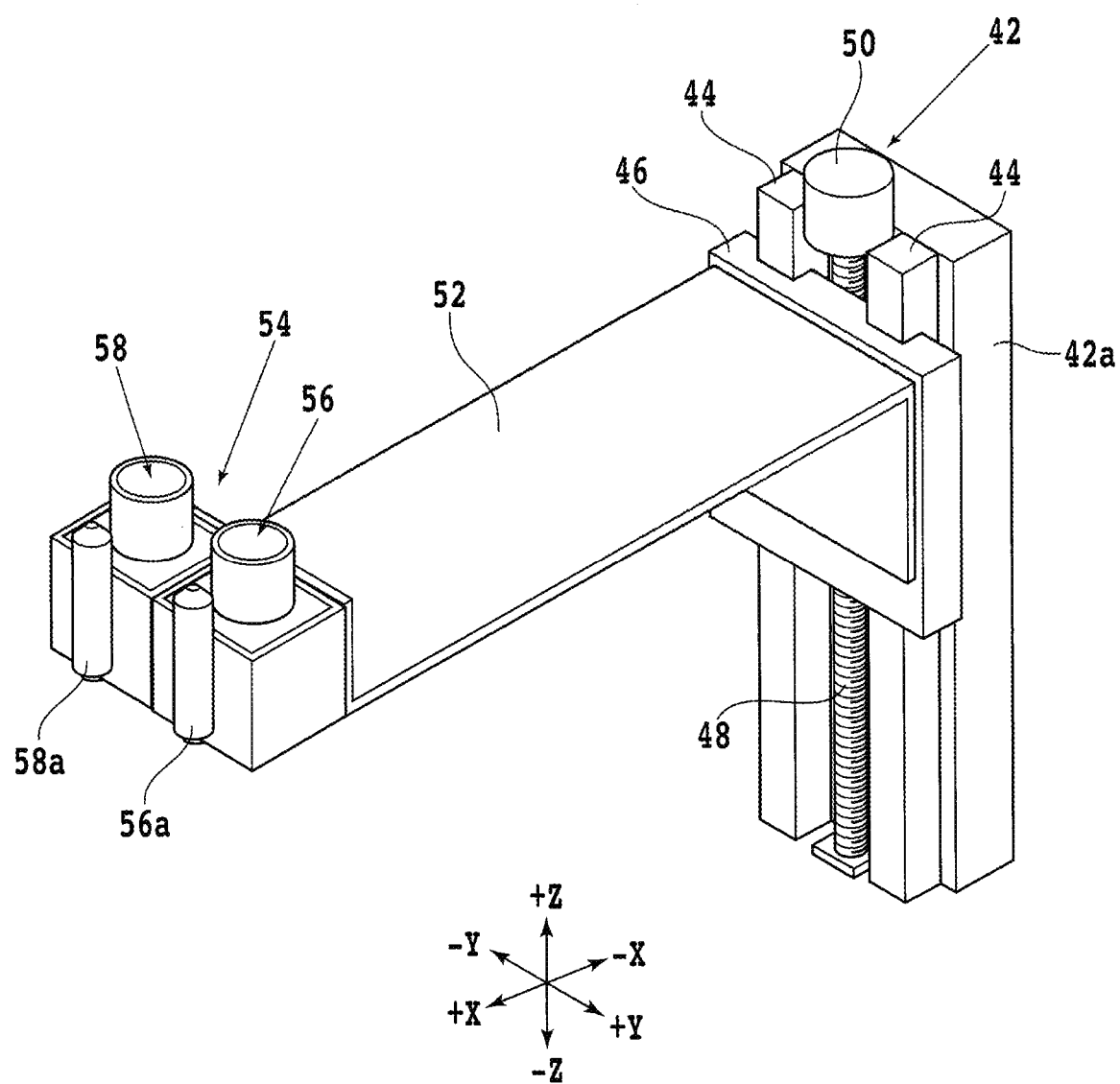
FIG. 6 is an enlarged perspective view of a Z-axis moving mechanism and other components of the cutting apparatus.

When the Y-axis movable table 36 moves in one of the Y-axis directions along the Y-axis guide rails 34, the reading head reads graduations of the Y-axis linear scale for the calculation of the position or coordinate in the Y-axis directions of the Y-axis movable table 36 and the distance that the Y-axis movable table 36 has moved in the Y-axis directions. A Z-axis moving mechanism 42 is disposed on an upper surface of the Y-axis movable table 36. FIG. 6 illustrates the Z-axis moving mechanism 42 and other components in enlarged perspective. The Z-axis moving mechanism 42 has a support structure 42a fixed to the upper surface of the Y-axis movable table 36.

A pair of Z-axis guide rails 44 that extend generally parallel to the Z-axis directions are fixed to a side surface of the support structure 42a that faces the X-axis movable table 18. A Z-axis movable plate 46 is slidable on and along the Z-axis guide rails 44. A nut, not illustrated, is mounted on a side surface of the Z-axis movable plate 46 that faces the support structure 42a and is operatively threaded over a Z-axis ball screw 48 disposed between and extending generally parallel to the Z-axis guide rails 44.

The Z-axis ball screw 48 has an end coupled to a Z-axis stepping motor 50. When the Z-axis stepping motor 50 is energized, it rotates the Z-axis ball screw 48 about its central axis, causing the nut to move the Z-axis movable plate 46 in one of the Z-axis directions along the Z-axis guide rails 44. The support structure 42a, the Z-axis guide rails 44, the Z-axis ball screw 48, the Z-axis stepping motor 50, etc. jointly make up the Z-axis moving mechanism 42 for moving the Z-axis movable plate 46 along the Z-axis guide rails 44. A Z-axis linear scale, not illustrated, for use in the detection of the position of the Z-axis movable plate 46 in the Z-axis directions is disposed adjacent to and extends along one of the Z-axis guide rails 44. A reading head, not illustrated, is mounted on a side surface of the Z-axis movable plate 46 in facing relation to the Z-axis linear scale. When the Z-axis movable plate 46 moves in one of the Z-axis directions along the Z-axis guide rails 44, the reading head reads graduations of the Z-axis linear scale for the calculation of the position or coordinate in the Z-axis directions of the Z-axis movable plate 46 and the distance that the Z-axis movable plate 46 has moved in the Y-axis directions.

A lower image capturing unit 54, i.e., a second image capturing unit, is fixed to the Z-axis movable plate 46 by a support arm 52 that is elongate in the X-axis directions. The lower image capturing unit 54 includes a low-magnification camera 56 and a high-magnification camera 58. Each of the low-magnification camera 56 and the high-magnification camera 58 includes an optical system such as a condensing lens and an image capturing device, i.e., a second image capturing device, such as a charge-coupled-device (CCD) image sensor, or a complementary-metal-oxide-semiconductor (CMOS) image sensor.

The lower image capturing unit 54 is disposed in a position lower than the chuck table 10 and faces the other surface 12b of the holding member 12 such that the optical axes of the condensing lenses extend substantially perpendicularly to the other surface 12b of the holding member 12. An illuminating device 56a for applying visible light to a subject positioned above, e.g., the workpiece 11, is disposed alongside of the low-magnification camera 56. Similarly, an illuminating device 58a for applying visible light to a subject positioned above, i.e., the workpiece 11, is disposed alongside of the high-magnification camera 58.

For capturing an image of the workpiece 11 with the lower image capturing unit 54, the X-axis movable table 18 is moved toward the Y-axis movable table 36 until the lower image capturing unit 54 is placed in the space 18d in the X-axis movable table 18. Then, the lower image capturing unit 54 captures an image of the workpiece 11 placed on the surface 12a of the holding member 12 from below the holding member 12. In this manner, the lower image capturing unit 54 can capture a normal image, i.e., an image as actually seen, of the face side 11a of the workpiece 11. The lower image capturing unit 54 may not necessarily have two cameras, i.e., the low-magnification camera 56 and the high-magnification camera 58, but may have a single camera having a predetermined magnification.

Other components of the cutting apparatus 2 will be described below with reference to FIG. 1. Bellows-shaped dust- and drip-resistant covers that are flexibly extensible and contractible are disposed in the opening 4b in covering relation thereto on respective left and right sides of the top plate 18c of the X-axis movable table 18 in the +X direction and the −X direction. A portal-shaped support structure 4c is mounted on an upper surface of the base block 4 over and above the opening 4b. Two processing unit moving mechanisms 60 for moving an indexing feed unit and an incising feed unit are disposed on a side surface of the support structure 4c that faces an opening 4a side of the base block 4.

The processing unit moving mechanisms 60 share a pair of Y-axis guide rails 62 fixedly mounted on the side surface of the support structure 4c and extending generally parallel to the Y-axis directions. The processing unit moving mechanisms 60 include two Y-axis movable plates 64 slidably on and along the Y-axis guide rails 62 independently of each other. Nuts, not illustrated, are mounted on respective surfaces of the Y-axis movable plates 64 that face the support structure 4c and are operatively threaded over respective Y-axis ball screws 66 disposed between and generally parallel to the Y-axis guide rails 62. Specifically, the nuts on the Y-axis movable plates 64 are operatively threaded respectively over the different Y-axis ball screws 66.

The Y-axis ball screws 66 have respective ends coupled to respective Y-axis stepping motors 68 (one illustrated). When the Y-axis stepping motors 68 are energized, they rotate the respective Y-axis ball screws 66 about their central axes, causing the nuts to move the Y-axis movable plates 64 in the Y-axis directions along the Y-axis guide rails 62. The Y-axis movable plates 64 support on their surfaces facing away from the support structure 4c respective pairs of Z-axis guide rails 72 extending generally parallel to the Z-axis directions. Z-axis movable plates 70 are slidable on and along the respective pairs of the Z-axis guide rails 72.

Nuts, not illustrated, are mounted on respective surfaces of the Z-axis movable plates 70 that face the support structure 4c, i.e., the Y-axis movable plates 64, and are operatively threaded over respective Z-axis ball screws 74 disposed between and generally parallel to the pairs of the Z-axis guide rails 72. The Z-axis ball screws 74 have respective ends coupled to respective Z-axis stepping motors 76. When the Z-axis stepping motors 76 are energized, they rotate the Z-axis ball screws 74 about their central axes, causing the nuts to move the Z-axis movable plates 70 in the Z-axis directions along the Z-axis guide rails 72.

Two cutting units, i.e., processing units 78 are mounted on respective lower portions of the Z-axis movable plates 70. Each of the cutting units 78 includes a tubular spindle housing 80 in which a portion of a cylindrical spindle 82a (see FIG. 7) is rotatably housed. The spindle 82a has an end coupled to a rotating mechanism, not illustrated, such as an electric motor for rotating the spindle 82a about its central axis. A cutting blade 82b having an annular cutting edge is mounted on the other end of the spindle 82a.

Figure 7:
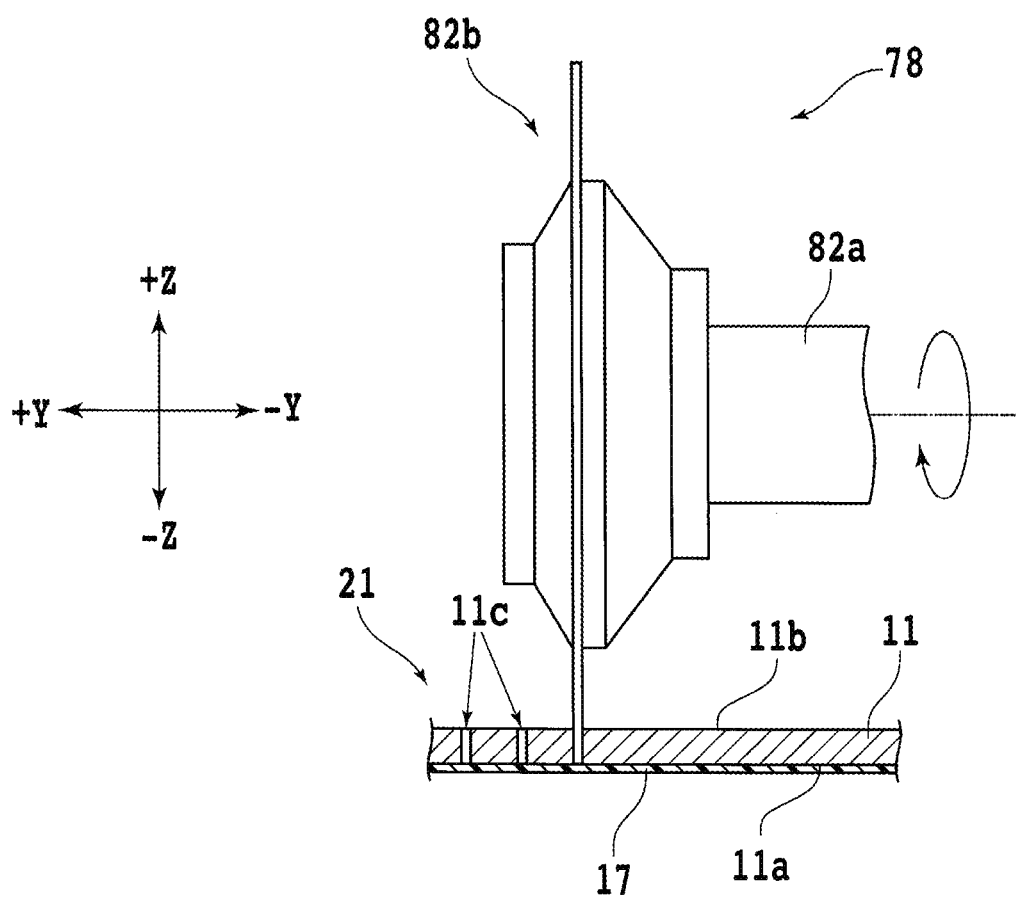
FIG. 7 is a side elevational view, partly in cross section, illustrating a cutting step.

For cutting, i.e., processing, the workpiece 11 with the cutting blade 82b, the face side 11a of the workpiece 11 is held under suction on the chuck table 10, and thereafter the chuck table 10 is turned to orient the projected dicing lines 13 of the first group substantially parallel to the X-axis directions. Then, the lower end of the cutting blade 82b which is rotating is positioned between the face side 11a and the surface 12a of the holding member 12 in alignment with one of the projected dicing lines 13 of the first group, and the chuck table 10 is moved in one of the X-axis directions, i.e., the +X direction or the −X direction. As illustrated in FIG. 7, the rotating cutting blade 82b cuts into the workpiece 11, forming a cut groove, i.e., a processed groove 11c in the workpiece 11. FIG. 7 illustrates the manner in which the rotating cutting blade 82b forms a cut groove 11c in the workpiece 11, and also illustrates cut grooves 11c already formed in the workpiece 11.

Each of the cut grooves 11c according to the present embodiment is a fully cut groove extending all the way through the workpiece 11 from the reverse side 11b to the face side 11a thereof. The cut groove 11c may occasionally be formed obliquely to a thicknesswise direction of the workpiece 11 or formed in a tapered shape from the reverse side 11b to the face side 11a of the workpiece 11. Therefore, it is desirable to assess how the cut groove 11c has been formed in the workpiece 11. According to the present embodiment, the shape of the cut groove 11c is confirmed using the lower image capturing unit 54, i.e., the second image capturing unit, described above and an upper image capturing unit 84, i.e., a first image capturing unit (see FIG. 1).

Actually, two upper image capturing units 84 are coupled to respective lower portions of the Z-axis movable plates 70 adjacent to the cutting units 78. Each of the upper image capturing units 84 includes an optical system such as a condensing lens, and an image capturing device, i.e., a first image capturing device. The upper image capturing units 84 are positioned above the chuck table 10 in facing relation to the surface 12a of the holding member 12 such that the condensing lenses have their optical axes substantially perpendicular to the surface 12a of the holding member 12. The upper image capturing units 84 capture an image of the reverse side 11b of the workpiece 11 whose face side 11a is held on the surface 12a of the holding member 12. In this manner, normal images of the reverse side 11b of the workpiece 11 are acquired.

The base block 4 also has an upwardly open opening 4d defined therein that is positioned across the opening 4b from the opening 4a. The opening 4d houses therein a cleaning unit 86 for cleaning a workpiece 11, etc. after it has been cut. The cleaning unit 86 includes a cleaning table 88 for holding the workpiece 11 under suction thereon and a nozzle 90 having an ejection port facing the cleaning table 88. The base block 4 supports thereon a casing, not illustrated, having a front side surface on which there are disposed a touch panel 92, i.e., a display panel, that doubles as an input device and a display device. The touch panel 92 displays images captured by at least one of the lower image capturing unit 54 and the upper image capturing unit 84, processing conditions, a graphical user interface (GUI), etc. The input device and the display device may be separate from each other. In case the input device and the display device are separate from each other, a display device such as a video monitor, or a computer screen, and an input device such as a keyboard, or a mouse, as a user interface, rather than the touch panel 92, are mounted on the front side surface of the casing, for example.

The cutting apparatus 2 includes a controller 94 for controlling the suction source 14, the X-axis moving mechanism 26, the rotary actuator 30, the Y-axis moving mechanism 32, the Z-axis moving mechanism 42, the lower image capturing unit 54, the processing unit moving mechanisms 60, the upper image capturing units 84, the cutting units 78, the touch panel 92, etc. The controller 94 is arranged as a computer including a processing device such as a processor typified by a central processing unit (CPU), a main storage device such as a dynamic random access memory (DRAM), a static random access memory (SRAM), or a read only memory (ROM), and an auxiliary storage device such as a flash memory, a hard disk drive, or a solid state drive.

The auxiliary storage device stores software including predetermined programs. The functions of the controller 94 are performed by the processing device as it operates according to the software stored in the auxiliary storage device. Note that part of the auxiliary storage device functions as a storage section 96 that stores therein programs for controlling the processing device to perform a predetermined image processing process to generate three-dimensional images. Image acquisition and image processing according to the present embodiment will be described below. According to the present embodiment, the upper image capturing unit 84 and the lower image capturing unit 54 capture images of the cut groove 11c while positioning their focal points successively at a plurality of different positions along a thicknesswise direction of the workpiece 11.

Figure 8:
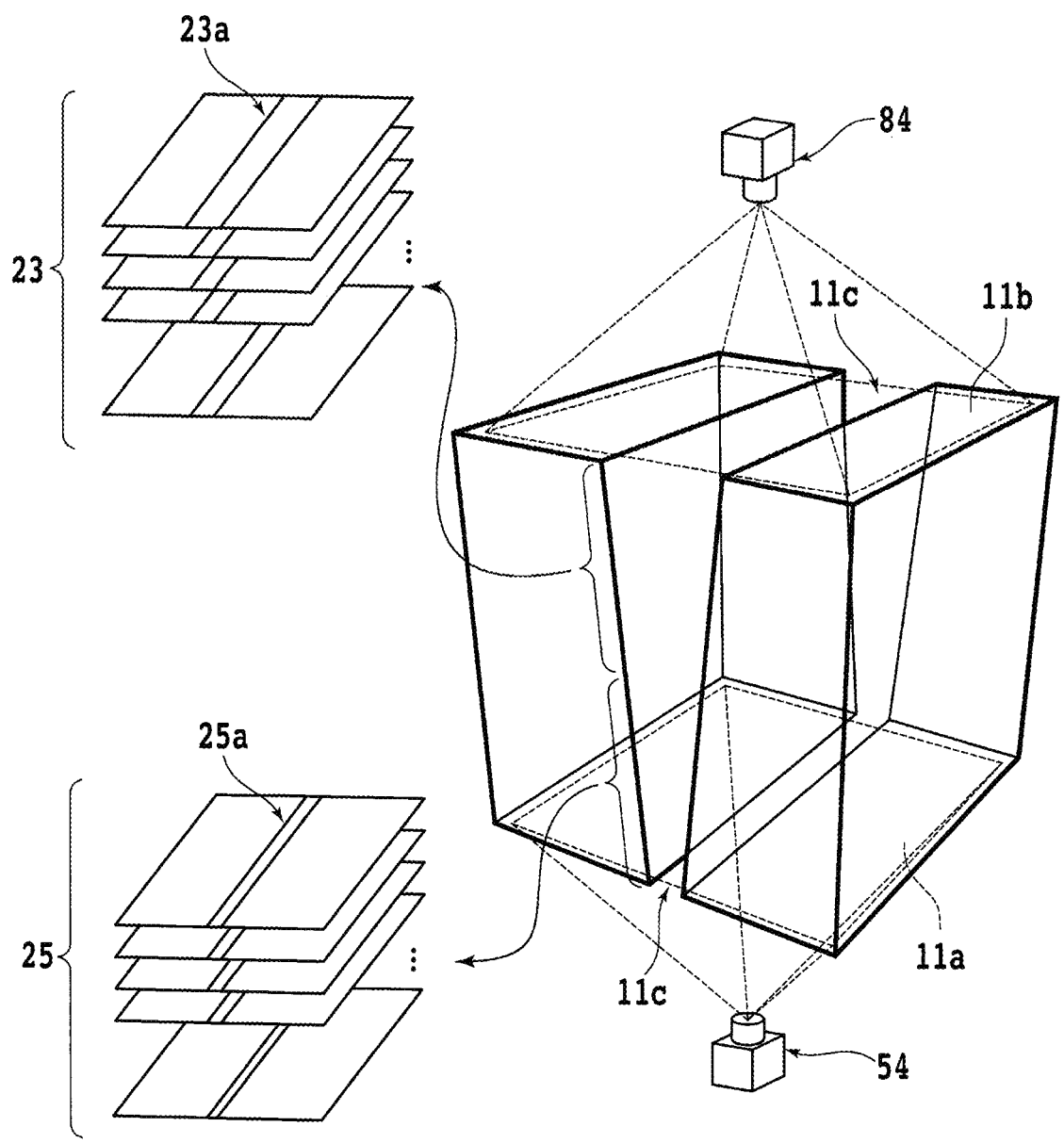
FIG. 8 is a view illustrating the manner in which upper and lower image capturing units capture images of a tapered cut groove.

The workpiece 11 is disposed in position such that the thicknesswise direction of the workpiece 11 from the face side 11a toward the reverse side 11b thereof extends substantially parallel to the Z-axis directions. FIG. 8 illustrates the manner in which the upper image capturing unit 84 and the lower image capturing unit 54 capture images of a tapered cut groove 11c. According to the present embodiment, after the upper image capturing unit 84 that has its focal point aligned with the reverse side 11b has captured an image of the cut groove 11c, the processing unit moving mechanism 60 moves the upper image capturing unit 84 downwardly successively to positions spaced by pitches of 1 μm while at the same time the upper image capturing unit 84 captures images of the cut groove 11c at the respective positions to which the upper image capturing unit 84 has been moved. In this manner, the upper image capturing unit 84 obtains a first image group 23. Furthermore, after the lower image capturing unit 54 that has its focal point aligned with the face side 11a has captured an image of the cut groove 11c, the Z-axis moving mechanism 42 moves the lower image capturing unit 54 upwardly successively to positions spaced by pitches of 1 μm while at the same time the lower image capturing unit 54 captures images of the cut groove 11c at the respective positions to which the lower image capturing unit 54 has been moved. In this manner, the lower image capturing unit 54 obtains a second image group 25.

At this time, the X-axis moving mechanism 26, the Y-axis moving mechanism 32, the processing unit moving mechanism 60, etc. adjust the XY coordinates of the condensing lenses to allow the lower image capturing unit 54 and the upper image capturing unit 84 to capture images of corresponding areas in the thicknesswise direction of the workpiece 11. The images of the first image group 23 and the images of the second image group 25 may not necessarily be captured in any particular sequences, but may be captured in any desired sequences. The upper image capturing unit 84 may be moved upwardly to positions spaced by predetermined pitches, and the lower image capturing unit 54 may be moved downwardly to positions spaced by predetermined pitches.

Each of the images of the first image group 23 includes a piece of first image information 23a representing the edges of the cut groove 11c at the depth corresponding to the focal point, i.e., representing the shape of the cut groove 11c. Similarly, each of the images of the second image group 25 includes a piece of second image information 25a representing the edges of the cut groove 11c at the depth corresponding to the focal point, i.e., representing the shape of the cut groove 11c. After the images have been acquired, they are processes by image processing. According to the image processing, the pieces of first image information 23a that are included in the respective images of the first image group 23 and the pieces of second image information 25a that are included in the respective images of the second image group 25 are ordered into a sequence along the thicknesswise direction of the workpiece 11 successively at the focal points by way of image processing. However, the pieces of the first image information 23a and the pieces of the second image information 25a are discrete along the thicknesswise direction of the workpiece 11.

Then, the area between adjacent ones of the pieces of the first and second image information 23a and 25a is interpolated by way of nearest neighbor interpolation, bilinear interpolation, or the like, thereby generating a three-dimensional image of the cut groove 11c. The generated three-dimensional image is displayed on the touch panel 92 (see FIG. 9). The operator can now confirm the accuracy with which the cut groove 11c has been processed by confirming the shape of the cut groove 11c with the three-dimensional image. Therefore, it is not necessary to deliver the workpiece 11 from the cutting apparatus 2 to a microscope and to visually inspect the workpiece 11 with the microscope. Furthermore, since the operator can confirm the accuracy with which the cut groove 11c has been processed on the cutting apparatus 2, the work efficiency is better than if the operator visually inspects the workpiece 11 with a microscope.

Next, a processing process of processing the workpiece 11 on the cutting apparatus 2 will be described below. First, the workpiece unit 21 with the reverse side 11b exposed upwardly is placed on the surface 12a of the chuck table 10 in placing step S10. After placing step S10, the suction source 14 is actuated to hold the face side 11a of the workpiece 11 under suction on the surface 12a with the tape 17 interposed therebetween, and the frame 19 is held on the frame suction plate, not illustrated, in holding step S20. After holding step S20, teaching step S30 is carried out.

In teaching step S30, while an image of the face side 11a that is captured by the lower image capturing unit 54 and converted into a mirror image is being displayed in real time on the touch panel 92, the operator searches for an alignment mark, not illustrated, on the face side 11a. After the operator has found the desired alignment mark, an image of the face side 11a that includes the alignment mark is captured by the lower image capturing unit 54. The shape, coordinates, etc. of the alignment mark are stored as a template for a pattern matching process in the storage section 96, for example. The distance between the alignment mark and the central lines of projected dicing lines 13 and the distance, i.e., a street pitch, between adjacent two of the projected dicing lines 13 in the Y-axis directions are stored in the storage section 96. Note that the stored coordinates represent XY coordinates of an XY coordinate system whose origin is located at the point $12c_3$.

After teaching step S30, an alignment process is carried out in alignment step S40. In alignment step S40, the operator works also while a normal image of the face side 11a that is captured by the lower image capturing unit 54 and converted into a mirror image is being displayed in real time on the touch panel 92. In alignment step S40, images of the face side 11a are first captured by the lower image capturing unit 54 at a plurality of locations that are spaced from each other on a projected dicing line 13 along the X-axis directions.

Then, a pattern that is identical to the alignment mark stored as the template is detected in the images captured of the face side 11a at the plurality of locations according to a predetermined process such as a pattern matching process. An angular shift in a θ direction of a projected dicing lines 13 extending in the first direction about the central axis of the holding member 12 is specified on the basis of the detected pattern that is identical to the alignment mark. Thereafter, the rotary actuator 30 is energized to move the endless belt 28 to turn the holding member 12 for thereby correcting the projected dicing line 13 out of the angular shift in the θ direction. In this manner, the projected dicing line 13 extending in the first direction is oriented substantially parallel to the X-axis directions.

After alignment step S40, the workpiece 11 is cut in cutting step S50 while the face side 11a thereof is being held under suction on the chuck table 10 (see FIG. 7). Cutting step S50 as it is carried out by one of the cutting units 78 will be described below as the cutting units 78 operate in the same manner as each other. In cutting step S50, the cutting blade 82b that is rotating at a high speed is positioned on an extension of the projected dicing line 13. At this time, the lower end of the cutting blade 82b is vertically positioned between the face side 11a of the workpiece 11 and the surface 12a of the holding member 12. Then, the X-axis moving mechanism 26 moves the chuck table 10 and the cutting blade 82b relatively to each other along the X-axis directions. The cutting blade 82b now cuts the workpiece 11 fully across its thickness, forming a cut groove 11c in the thicknesswise direction of the workpiece 11 along the projected dicing line 13.

After the workpiece 11 has been cut along the projected dicing line 13 parallel to the X-axis directions, the cutting unit 78 is indexing-fed to position the cutting blade 82b on an extension of another projected dicing line 13 that is adjacent in the Y-axis directions to the projected dicing line 13 along which the cut groove 11c has been formed. Then, the workpiece 11 is cut along the projected dicing line 13 by the cutting blade 82b in the same manner as described above. After the workpiece 11 has been cut along all the projected dicing lines 13 parallel to the first direction, the rotary actuator 30 is energized to turn the chuck table 10 through 90 degrees to bring the projected dicing lines extending in the second direction into alignment with the X-axis directions. Thereafter, the cutting unit 78 cuts the workpiece 11 successively along all the projected dicing lines extending in the second direction in the manner described above.

Figure 9:
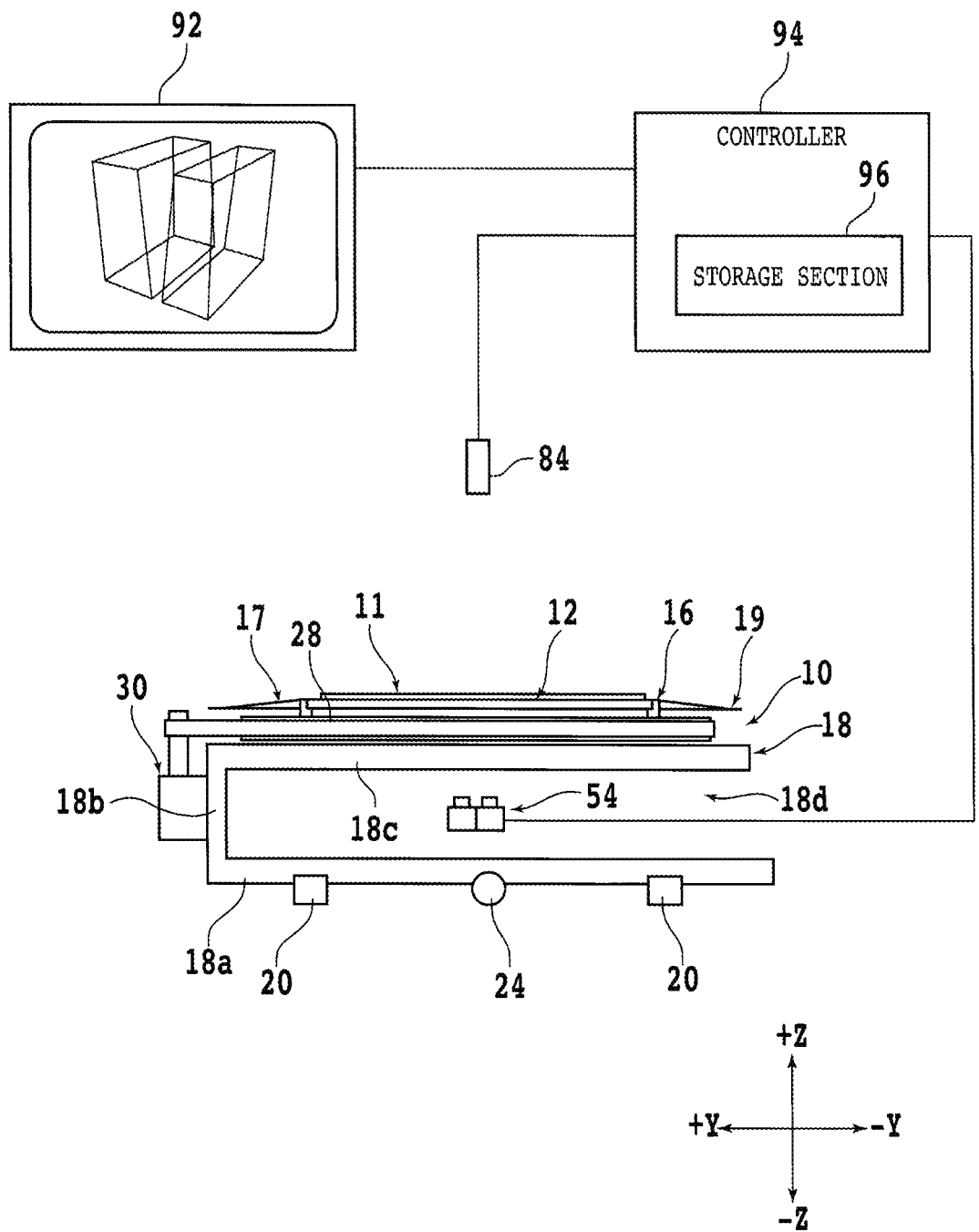
FIG. 9 is a view illustrating a kerf checking step.

After cutting step S50, kerf checking step S60 is carried out. FIG. 9 illustrates kerf checking step S60. In kerf checking step S60, the upper image capturing unit 84 and the lower image capturing unit 54 capture images of the cut groove 11c while positioning their focal points successively at a plurality of different positions along a thicknesswise direction of the workpiece 11. The operator can confirm the accuracy with which the cut groove 11c has been processed by confirming the shape of the cut groove 11c with a three-dimensional image displayed on the touch panel 92. Therefore, it is not necessary to deliver the workpiece 11 from the cutting apparatus 2 to a microscope and to visually inspect the workpiece 11 with the microscope. Furthermore, since the operator can confirm the accuracy with which the cut groove 11c has been processed on the cutting apparatus 2, the work efficiency is better than if the operator visually inspects the workpiece 11 with a microscope. Incidentally, according to the present embodiment, kerf checking step S60 is carried out after the completion of cutting step S50. However, kerf checking step S60 may be carried out during cutting step S50 providing one or more cut grooves 11c have been formed.

According to the above embodiment, the upper image capturing unit 84 and the lower image capturing unit 54 capture images of the cut groove 11c while changing the focal points of both of them. As the focal points of both of the upper image capturing unit 84 and the lower image capturing unit 54 are changed, the shape of the cut groove 11c can appropriately be grasped by interpolating blind areas of their fields of vision to be captured even if the cut groove 11c is of a tapered shape or the cut groove 11c is formed obliquely to the thicknesswise direction of the workpiece 11. However, only the upper image capturing unit 84 may capture images of the cut groove 11c while positioning its focal point successively at a plurality of different positions along a thicknesswise direction of the workpiece 11. In this case, the upper image capturing unit 84 captures images of the cut groove 11c, acquiring a first image group 23.

Then, the pieces of the first image information 23a that are included in the respective images of the first image group 23 are ordered into a sequence along the thicknesswise direction of the workpiece 11 by image processing. However, inasmuch as the pieces of the first image information 23a are discrete along the thicknesswise direction of the workpiece 11, the area between adjacent ones of the pieces of the first image information 23a is interpolated, thereby generating a three-dimensional image of the cut groove 11c. Incidentally, to the three-dimensional image, there may be added a face-side image captured of the face side 11a by the lower image capturing unit 54 with its focal point positioned on the face side 11a and auxiliary lines for interpolating the area between the three-dimensional image and the face-side image.

Similarly, only the lower image capturing unit 54 may capture images of the cut groove 11c while positioning its focal point successively at a plurality of different positions along the thicknesswise direction of the workpiece 11. In this case, the lower image capturing unit 54 captures images of the cut groove 11c, acquiring a second image group 25. Then, the pieces of the second image information 25a that are included in the respective images of the second image group 25 are ordered into a sequence along the thicknesswise direction of the workpiece 11 by way of image processing. However, inasmuch as the pieces of the second image information 25a are discrete along the thicknesswise direction of the workpiece 11, the area between adjacent ones of the pieces of the second image information 25a is interpolated, thereby generating a three-dimensional image of the cut groove 11c. Incidentally, to the three-dimensional image, there may be added a reverse-side image captured of the reverse side 11b by the upper image capturing unit 84 with its focal point positioned on the reverse side 11b and an auxiliary line for interpolating the area between the three-dimensional image and the reverse-side image.

In this manner, at least a partial three-dimensional image of the cut groove 11c may be generated by ordering the pieces of at least either the first image information 23a or the second image information 25a into a sequence along the thicknesswise direction of the workpiece 11. Even in this case, the operator can confirm the accuracy with which the cut groove 11c has been processed by confirming the shape of the cut groove 11c with the three-dimensional image.

Figure 10:
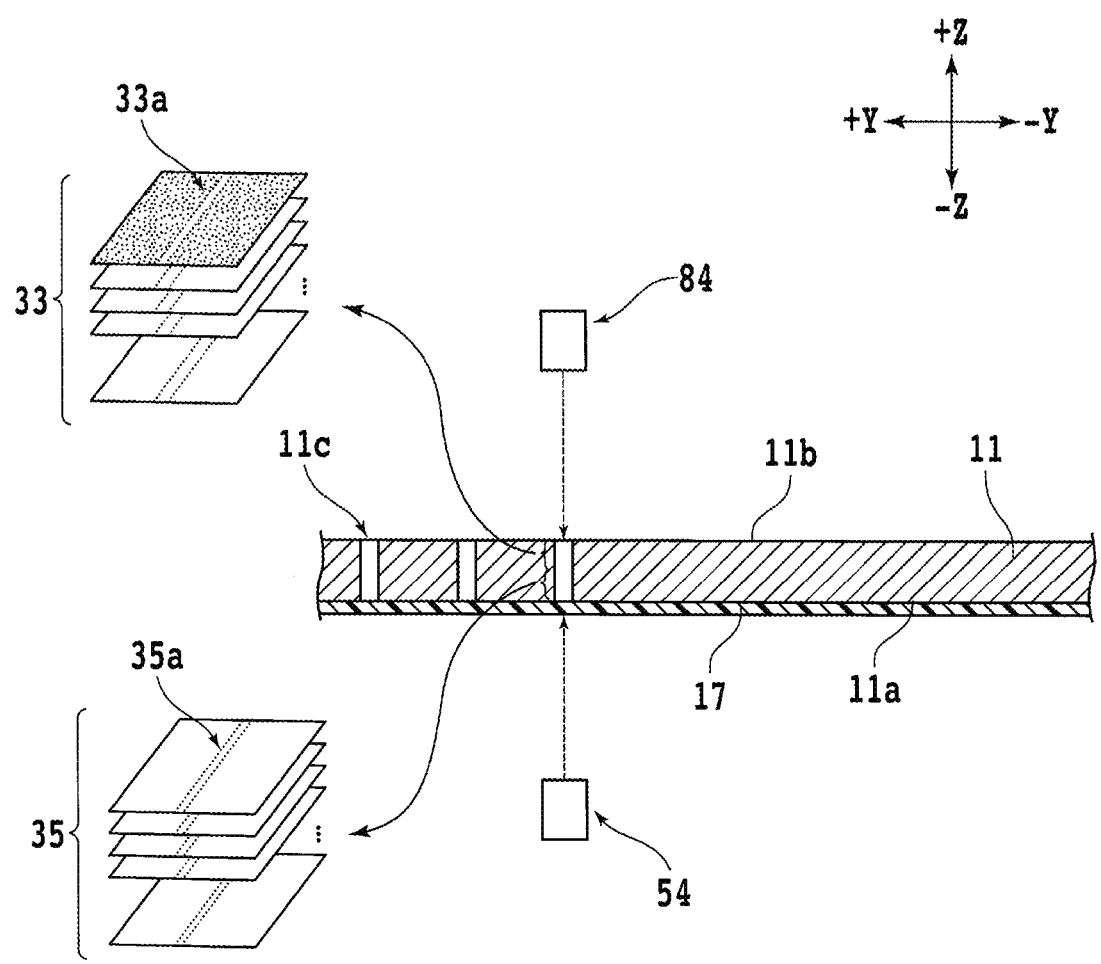
FIG. 10 is a view illustrating the manner in which the kerf checking step is carried out using an interferometric optical system.

A modification of the first embodiment will be described below. According to the modification, each of the upper image capturing unit 84 and the lower image capturing unit 54 includes an image capturing unit having an interferometric optical system. The interferometric optical system may be of the Mirau type, the Michelson type, the Linnik type, or the like. FIG. 10 illustrates the manner in which kerf checking step S60 is carried out using an interferometric optical system. In case an interferometric optical system is used, the upper image capturing unit 84 and the lower image capturing unit 54 also capture images of the cut groove 11c while positioning their focal points successively at a plurality of different positions along a thicknesswise direction of the workpiece 11.

For example, while the focal point of the upper image capturing unit 84 is being positioned on the reverse side 11b, the chuck table 10 is moved a predetermined distance along the X-axis directions. Then, after the upper image capturing unit 84 has been moved a predetermined distance along the Y-axis directions, the upper image capturing unit 84 is moved a predetermined distance back along the X-axis directions. In this fashion, the focal point of the upper image capturing unit 84 is scanned in a predetermined XY plane on the reverse side 11b. Interference light having a high light intensity is produced in locations where the focal point of the upper image capturing unit 84 is positioned.

After the upper image capturing unit 84 has scanned the reverse side 11b, the processing unit moving mechanism 60 moves the upper image capturing unit 84 downwardly by 0.1 μm. At the vertical position thus reached, the focal point of the upper image capturing unit 84 is scanned again in a predetermined XY plane. While repeatedly moving the upper image capturing unit 84 downwardly by 0.1 μm and scanning the focal point of the upper image capturing unit 84 in predetermined XY planes at the vertical positions reached, the upper image capturing unit 84 acquires a first image group 33.

The images of the first image group 33 include a first point group, i.e., pieces of first image information 33a representing points where interference light having a high light intensity is produced as the focal point is positioned on the edges of the cut groove 11c. In other words, the first point group 33a identifies inner walls of the cut groove 11c and represents the shape of the cut groove 11c. Similarly, after the lower image capturing unit 54 has scanned the face side 11a, the Z-axis moving mechanism 42 repeatedly moves the lower image capturing unit 54 upwardly by 0.1 μm, and the focal point of the lower image capturing unit 54 is scanned in predetermined XY planes at the vertical positions reached, thereby capturing images of the cut groove 11c. In this manner, the lower image capturing unit 85 acquires a second image group 35.

Figure 11A:
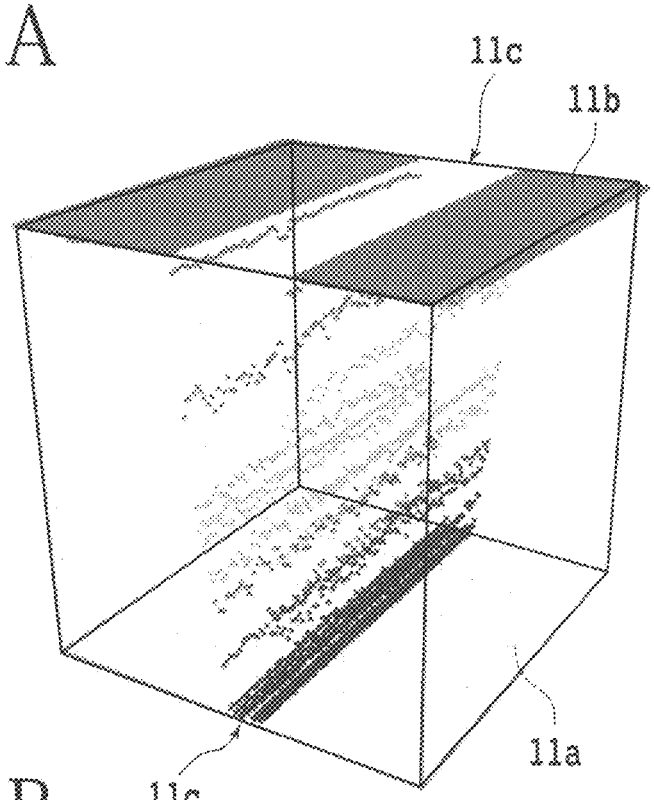
FIG. 11A is a view illustrating by way of example a three-dimensional image of a cut groove whose shape is represented by a group of points.
Figure 11B:
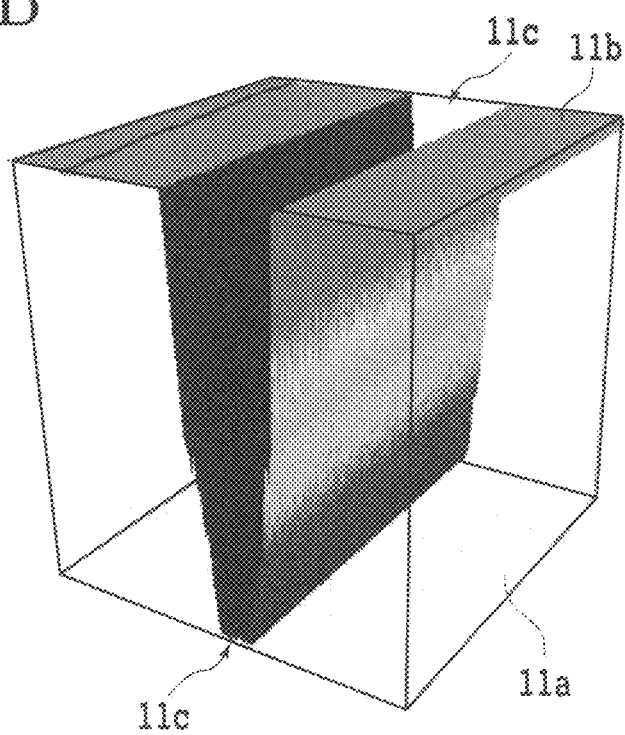
FIG. 11B is a view illustrating by way of example a three-dimensional image of the cut groove that is obtained after an interpolating process.

The images of the second image group 35 include a second point group, i.e., pieces of second image information 35a representing the shape of the cut groove 11c. The points of both of the first point group 33a and the second point group 35a are ordered into a sequence along the thicknesswise direction of the workpiece 11 by way of image processing, thereby generating a three-dimensional image of the cut groove 11c. The generated three-dimensional image is displayed on the touch panel 92. FIG. 11A illustrates by way of example a three-dimensional image of the cut groove 11c whose shape is represented by a group of points. Note that a three-dimensional image of the cut groove 11c may be generated by interpolating the area between adjacent points. FIG. 11B illustrates by way of example a three-dimensional image of the cut groove 11c that is obtained after an interpolating process.

The operator can confirm the accuracy with which the cut groove 11c has been processed by confirming the shape of the cut groove 11c with the three-dimensional image illustrated in FIG. 11A or 11B. Therefore, it is not necessary to deliver the workpiece 11 from the cutting apparatus 2 to a microscope and to visually inspect the workpiece 11 with the microscope. Furthermore, since the operator can confirm the accuracy with which the cut groove 11c has been processed on the cutting apparatus 2, the work efficiency is better than if the operator visually inspects the workpiece 11 with a microscope. Incidentally, in this manner, at least a partial three-dimensional image of the cut groove 11c may be generated by ordering the points of at least either the first point group 33a or the second point group 35a into a sequence along the thicknesswise direction of the workpiece 11.

Figure 12:
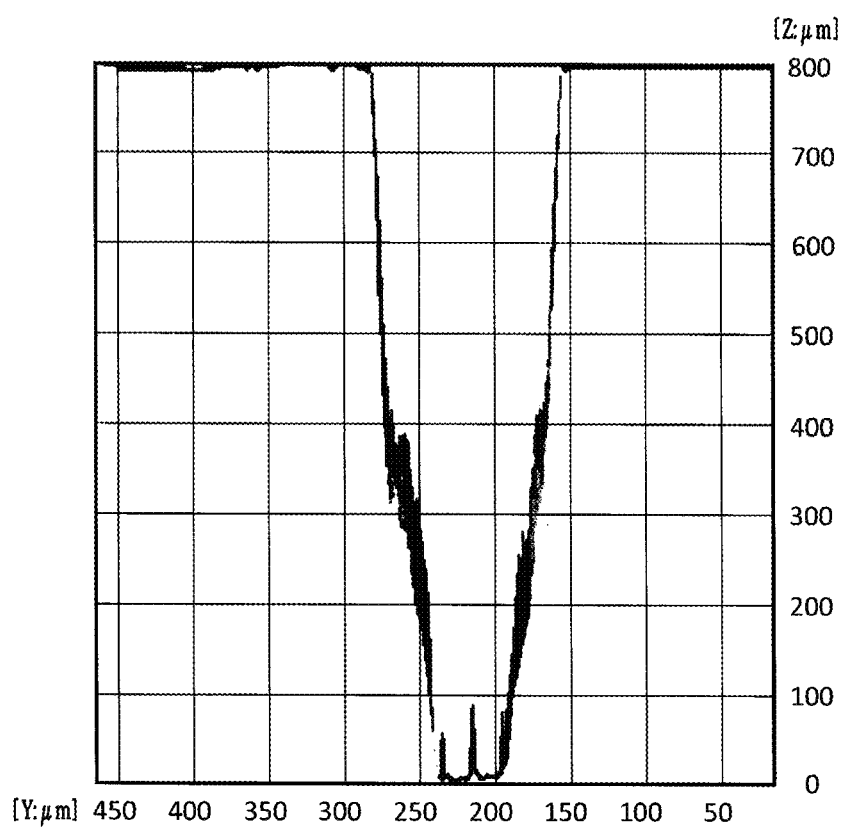
FIG. 12 is a diagram illustrating a sectional profile of the cut groove.

FIG. 12 illustrates a sectional profile of the cut groove 11c that is obtained by severing the cut groove 11c extending substantially parallel to the X-axis directions with a YZ plane. The horizontal axis of FIG. 12 represents the width (μm) of the cut groove 11c and the vertical axis represents the depth (μm) of the cut groove 11c. In FIGS. 8 through 12, the cut groove 11c is tapered in a direction from the reverse side 11b toward the face side 11a. However, even in case the cut groove 11c is formed obliquely to the thicknesswise direction of the workpiece 11, the operator can confirm the accuracy with which the cut groove 11c has been processed on the cutting apparatus 2.

Figure 13:
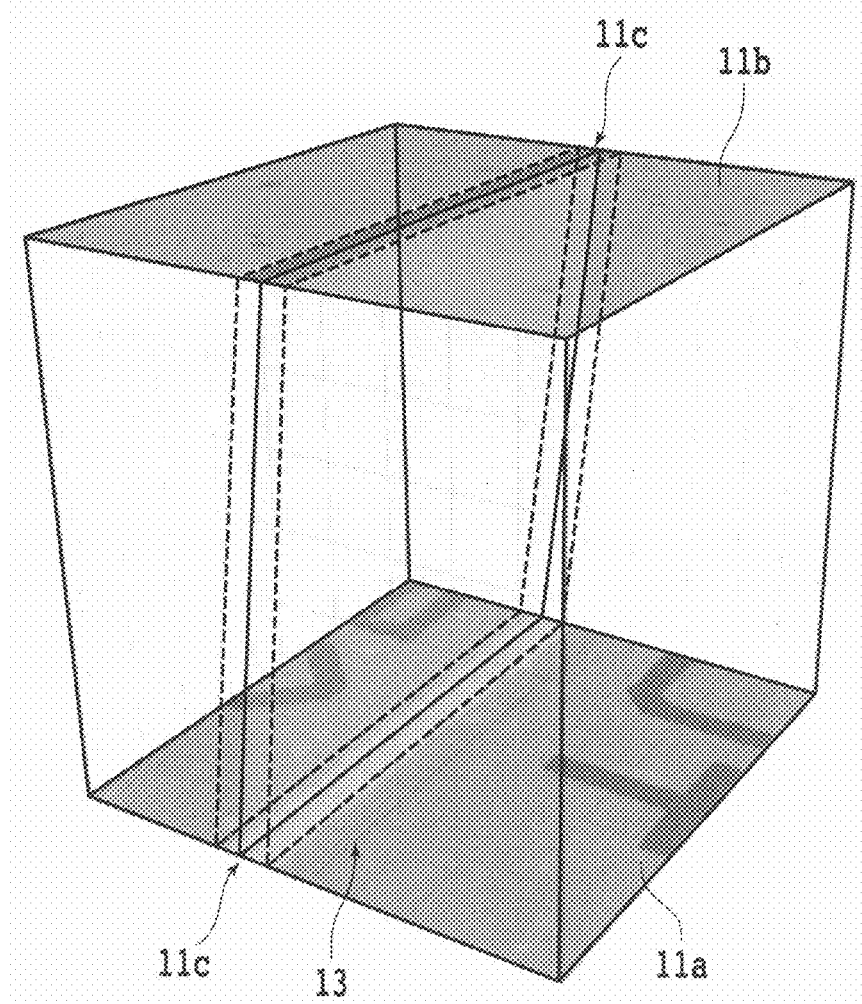
FIG. 13 is a schematic view of a three-dimensional image of a cut groove that is formed in a workpiece obliquely to a thicknesswise direction of the workpiece.

FIG. 13 schematically illustrates a three-dimensional image of a cut groove 11c that is formed in a workpiece 11 obliquely to a thicknesswise direction of the workpiece 11. Note that a reverse side 11b and a face side 11a illustrated in FIG. 13 represent images acquired respectively by the upper image capturing unit 84 and the lower image capturing unit 54 according to the first embodiment. The area between the reverse side 11b and the face side 11a is interpolated by auxiliary lines. Further, in FIG. 13, the broken lines represent edges of the cut groove 11c, whereas the solid lines represent the center of the width of the cut groove 11c. On the face side 11a, the cut groove 11c is formed in a position deviating from a projected dicing line 13. Even in case the cut groove 11c is formed obliquely, the shape of the cut groove 11c can be confirmed by generating a three-dimensional image according to the first embodiment or the modification thereof.

Figure 14:
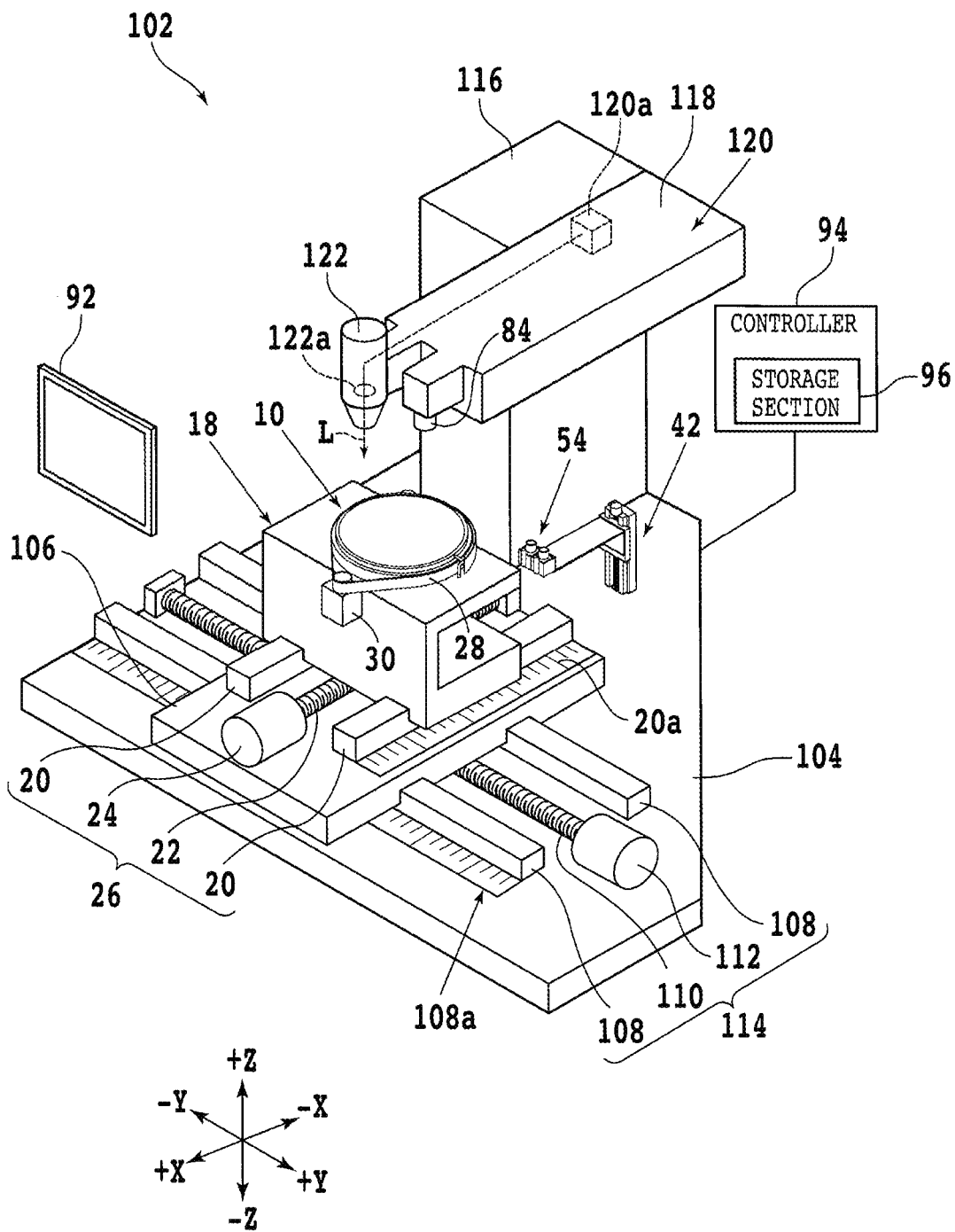
FIG. 14 is a perspective view of a laser processing apparatus as a processing apparatus according to a second embodiment of the present invention.

A second embodiment of the present invention will be described below. According to the second embodiment, a laser processing apparatus 102 instead of the cutting apparatus 2 is used as a processing apparatus to process a workpiece 11. On the laser processing apparatus 102, however, placing step S10 through alignment step S40 are carried out in the same manner as with the first embodiment. FIG. 14 illustrates in perspective the laser processing apparatus 102 according to the second embodiment. Note that those components of the cutting apparatus 2 which are identical to those according to the first embodiment are denoted by identical reference characters. The differences with the cutting apparatus 2 will mainly be described hereinbelow.

The laser processing apparatus 102 includes a stationary base block 104 with the lower image capturing unit 54 fixed thereto. Note that the lower image capturing unit 54 may alternatively be movable in the X-axis directions or the Y-axis directions. The X-axis movable table 18 is disposed on the stationary base block 104. The X-axis movable table 18 is disposed such that the lower image capturing unit 54 can enter the space 18d from a region positioned opposite the side plate 18b of the X-axis movable table 18.

The X-axis movable table 18 is slidable on and along the pair of X-axis guide rails 20 fixedly mounted on a Y-axis movable table 106. The nut, not illustrated, mounted on the lower surface of the bottom plate 18a of the X-axis movable table 18 is operatively threaded over the X-axis ball screw 22 disposed between and extending generally parallel to the X-axis guide rails 20.

The X-axis stepping motor 24 is connected to an end of the X-axis ball screw 22. When the X-axis stepping motor 24 is energized, it rotates the X-axis ball screw 22 about its central axis, causing the nut to move the X-axis movable table 18 in one of the X-axis directions along the X-axis guide rails 20. The Y-axis movable table 106 that supports the X-axis movable table 18 is slidable on and along a pair of Y-axis guide rails 108 fixedly mounted on an upper surface of the stationary base block 104. A Y-axis scale 108a for use in the detection of the position of the Y-axis movable table 106 in the Y-axis directions is disposed adjacent to and extends along one of the Y-axis guide rails 108.

A nut, not illustrated, is mounted on a lower surface of the Y-axis movable table 106 and is operatively threaded over a Y-axis ball screw 110 disposed between and extending generally parallel to the Y-axis guide rails 108. The Y-axis ball screw 110 has an end coupled to a Y-axis stepping motor 112. When the Y-axis stepping motor 112 is energized, it rotates the Y-axis ball screw 110 about its central axis, causing the nut to move the Y-axis movable table 106 in one of the Y-axis directions along the Y-axis guide rails 108. The Y-axis guide rails 108, the Y-axis ball screw 110, the Y-axis stepping motor 112, etc. jointly make up a Y-axis moving mechanism 114 for moving the Y-axis movable table 106 along the Y-axis guide rails 108.

A column 116 that projects upwardly from an upper surface of the stationary base block 104 is disposed adjacent to the lower image capturing unit 54. A casing 118 having an elongate portion extending substantially parallel to the X-axis directions is disposed on the column 116. The casing 118 houses therein at least part of a laser applying unit 120. The laser applying unit 120 has a laser oscillator 120a, etc. for emitting a pulsed laser beam having a wavelength absorbable by the workpiece 11 or a wavelength transmittable through the workpiece 11.

A laser beam applying head 122 including a condensing lens 122a is mounted on a distal end of the laser applying unit 120 in the +X direction. The laser beam emitted from the laser oscillator 120a is converged by the condensing lens 122a and directed downwardly from the laser beam applying head 122. In FIG. 14, the laser beam, denoted by L, directed downwardly from the laser beam applying head 122 is indicated by the broken-line arrow. Note that the upper image capturing unit 84 is disposed on a distal end of the casing 118 at a position adjacent to the laser beam applying head 122.

In cutting step S50 according to the second embodiment, the focused spot of the laser beam L is positioned near the reverse side 11b of the workpiece 11 and the focused spot of the laser beam L and the workpiece 11 are relatively moved in one of the X-axis directions to form a laser-processed groove, not illustrated, in the workpiece 11 along one of the projected dicing lines 13. In kerf checking step S60, the controller 94 generates a three-dimensional image of the cut groove 11c in the same manner as with the first embodiment and the modification thereof. The operator can confirm the accuracy with which the laser-processed groove has been processed by confirming the shape of the laser-processed groove with a three-dimensional image displayed on the touch panel 92. Therefore, it is not necessary to deliver the workpiece 11 from the laser processing apparatus 102 to a microscope and to visually inspect the workpiece 11 with the microscope. Furthermore, since the operator can confirm the accuracy with which the laser processing groove has been processed on the laser processing apparatus 102, the work efficiency is better than if the operator visually inspects the workpiece 11 with a microscope.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus for processing a plate-shaped workpiece while holding a face side of the workpiece that has a plurality of devices, each device being formed in respective areas demarcated by a plurality of projected dicing lines established on the face side, the processing apparatus comprising:
    a chuck table for holding the face side of the workpiece thereon, the chuck table having a holding member including a surface and another surface positioned opposite the surface and having a predetermined region made of a transparent material extending from the surface to the other surface;
    a processing unit for processing the workpiece whose face side is being held on the chuck table, thereby forming a processed groove in the workpiece;
    a first image capturing unit disposed above the chuck table and having a first image capturing device for capturing an image of a reverse side of the workpiece held on the chuck table, wherein the workpiece defines a Z-axis direction extending between the face side of the workpiece and the reverse side of the workpiece;
    a second image capturing unit disposed below the chuck table and having a second image capturing device for capturing an image of the face side of the workpiece through the holding member;
    a display device for displaying the image of the workpiece captured by at least either the first image capturing unit or the second image capturing unit; and
    a controller having a storage section for storing programs for performing an image processing process and a processing device for processing the images according to the programs stored in the storage section,
    wherein the first image capturing unit obtains a first image group of images of a first area of the reverse side of the workpiece captured of the processed groove while positioning a focal point thereof at a plurality of different positions along the Z-axis direction of the workpiece without moving the focal point in a direction perpendicular to the Z-axis direction, each of the images of the first image group including a piece of first image information representing a shape of the processed groove, and the second image capturing unit obtains a second image group of images of a second area of the face side of the workpiece captured of the processed groove while positioning a focal point thereof at a plurality of different positions along the Z-axis direction of the workpiece without moving the focal point in a direction perpendicular to the Z-axis direction, each of the images of the second image group including a piece of second image information representing a shape of the processed groove, and the controller orders the pieces of at least either the first image information or the second image information into a sequence along the Z axis direction of the workpiece, thereby generating a three-dimensional image of a portion of the processed groove, and displays the three-dimensional image on the display device.

2. The processing apparatus according to claim 1, wherein the controller orders the pieces of both the first image information and the second image information into a sequence along the Z axis direction of the workpiece, thereby generating a three-dimensional image of the processed groove, and displays the three-dimensional image on the display device.

3. A processing apparatus for processing a plate-shaped workpiece while holding a face side of the workpiece that has a plurality of devices, each device being formed in respective areas demarcated by a plurality of projected dicing lines established on the face side, the processing apparatus comprising:
  a chuck table for holding the face side of the workpiece thereon, the chuck table having a holding member including a surface and another surface positioned opposite the surface and having a predetermined region made of a transparent material extending from the surface to the other surface;
  a processing unit for processing the workpiece whose face side is being held on the chuck table, thereby forming a processed groove in the workpiece;
  a first image capturing unit disposed above the chuck table and having a first image capturing device for capturing an image of a reverse side of the workpiece held on the chuck table, wherein the workpiece defines a Z-axis direction extending between the face side of the workpiece and the reverse side of the workpiece;
  a second image capturing unit disposed below the chuck table and having a second image capturing device for capturing an image of the face side of the workpiece through the holding member;
  a display device for displaying the image of the workpiece captured by at least either the first image capturing unit or the second image capturing unit; and
  a controller having a storage section for storing programs for performing an image processing process and a processing device for processing the images according to the programs stored in the storage section,
  wherein the controller is configured and arranged to:
    obtain a first image group of images of the processed groove from the first image capturing unit by positioning a focal point thereof at an initial position along the Z-axis direction and relatively moving the focal point of the first image capturing unit and the workpiece with respect to each other in an X-axis direction, while maintaining the focal point of the first image capturing unit at the initial Z-axis position, to obtain an initial image of the first image group; then positioning the focal point of the first image capturing unit at an intermediate position along the Z-axis direction and relatively moving the focal point of the first image capturing unit and the workpiece with respect to each other in an X-axis direction, while maintaining the focal point of the first image capturing unit at the intermediate Z-axis position, to obtain an intermediate image of the first image group; and then positioning the focal point of the first image capturing unit at an additional position along the Z-axis direction and relatively moving the focal point of the first image capturing unit and the workpiece with respect to each other in an X-axis direction, while maintaining the focal point of the first image capturing unit at the additional Z-axis position, to obtain an additional image of the first image group, wherein each of the images of the first image group includes a piece of first image information representing a shape of the processed groove;
    obtain a second image group of images of the processed groove from the second image capturing unit by positioning a focal point thereof at an initial position along the Z-axis direction and relatively moving the focal point of the second image capturing unit and the workpiece with respect to each other in an X-axis direction, while maintaining the focal point of the second image capturing unit at the initial Z-axis position, to obtain an initial image of the second image group; then positioning the focal point of the second image capturing unit at an intermediate position along the Z-axis direction and relatively moving the focal point of the second image capturing unit and the workpiece with respect to each other in an X-axis direction, while maintaining the focal point of the second image capturing unit at the intermediate Z-axis position, to obtain an intermediate image of the second image group; and then positioning the focal point of the second image capturing unit at an additional position along the Z-axis direction and relatively moving the focal point of the second image capturing unit and the workpiece with respect to each other in an X-axis direction, while maintaining the focal point of the second image capturing unit at the additional Z-axis position, to obtain an additional image of the second image group, wherein each of the images of the second image group includes a piece of second image information representing a shape of the processed groove;
    order the pieces of at least either the first image information or the second image information into a sequence along the Z-axis direction of the workpiece, thereby generating a three-dimensional image of the processed groove; and
  display the three-dimensional image on the display device.

4. The processing apparatus according to claim 3, wherein the controller orders the pieces of both the first image information and the second image information into a sequence along the Z-axis direction of the workpiece, thereby generating a three-dimensional image of the processed groove, and displays the three-dimensional image on the display device.

5. The processing apparatus according to claim 3, wherein:
  the intermediate position of the focal point of the first image capturing unit comprises a plurality of intermediate positions along the Z-axis direction, such that a plurality of intermediate images of the first image group are obtained; and
  the intermediate position of the focal point of the second image capturing unit comprises a plurality of intermediate positions along the Z-axis direction, such that a plurality of intermediate images of the second image group are obtained.

6. The processing apparatus according to claim 4, wherein:
  the intermediate position of the focal point of the first image capturing unit comprises a plurality of intermediate positions along the Z-axis direction, such that a plurality of intermediate images of the first image group are obtained; and
  the intermediate position of the focal point of the second image capturing unit comprises a plurality of intermediate positions along the Z-axis direction, such that a plurality of intermediate images of the second image group are obtained.

* * * * *